United States Patent
Hwang

(10) Patent No.: US 8,154,095 B2
(45) Date of Patent: Apr. 10, 2012

(54) IMAGE SENSOR AND METHOD FOR MANUFACTURING THE SAME

(75) Inventor: Joon Hwang, Cheongju-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 118 days.

(21) Appl. No.: 12/566,788

(22) Filed: Sep. 25, 2009

(65) Prior Publication Data

US 2010/0079638 A1   Apr. 1, 2010

(30) Foreign Application Priority Data

Sep. 30, 2008   (KR) .................. 10-2008-0096082

(51) Int. Cl.
*H01L 27/14* (2006.01)
(52) U.S. Cl. .................. 257/431; 257/E31.112
(58) Field of Classification Search .................. 257/431, 257/440, 443, 444, E31.112; 438/57, 431, 438/440, 443, 444
See application file for complete search history.

(56) References Cited

U.S. PATENT DOCUMENTS

2009/0179291 A1* 7/2009 Nam et al. .................. 257/440

FOREIGN PATENT DOCUMENTS

| KR | 10-2005-0117674 A | 12/2005 |
| KR | 10-2006-0120260 A | 11/2006 |

\* cited by examiner

*Primary Examiner* — Matthew Reames
(74) *Attorney, Agent, or Firm* — Saliwanchik, Lloyd & Eisenschenk

(57) ABSTRACT

Provided is an image sensor that comprises a readout circuitry, an interlayer dielectric, an interconnection, an image sensing device, an ion implantation region, a contact, and a pixel separation layer. The readout circuitry is disposed at a first substrate. The interlayer dielectric is disposed on the first substrate. The interconnection is disposed in the interlayer dielectric, and electrically connected to the readout circuitry. The image sensing device is disposed on the interconnection, and comprises a first conductive type layer and a second conductive type layer. The contact electrically connects the first conductive type layer of the image sensing device and the interconnection. The ion implantation region is formed in the second conductive type layer at a region corresponding to the contact. The pixel separation layer is disposed at a pixel boundary of the image sensing device.

8 Claims, 6 Drawing Sheets

IMAGE SENSOR AND METHOD FOR MANUFACTURING THE SAME

CROSS-REFERENCE TO RELATED APPLICATIONS

This application claims the benefit under 35 U.S.C. §119 of Korean Patent Application No. 10-2008-0096082, filed Sep. 30, 2008, which is hereby incorporated by reference in its entirety.

BACKGROUND

The present disclosure relates to an image sensor and a method for manufacturing the same.

An image sensor is a semiconductor device for converting an optical image into an electric signal. The image sensor may be roughly classified into a charge coupled device (CCD) image sensor and a complementary metal oxide semiconductor (CMOS) image sensor (CIS).

During the fabrication of image sensors, a photodiode may be formed in a substrate using ion implantation. As the size of a photodiode is reduced for the purpose of increasing the number of pixels without increasing chip size, the area of a light receiving portion is also reduced, thereby resulting in a reduction in image quality.

Also, since a stack height does not reduce as much as the reduction in the area of the light receiving portion, the number of photons incident to the light receiving portion is also reduced due to diffraction of light called Airy disk.

As an alternative to overcome this limitation, an attempt of forming a photodiode using amorphous silicon (Si), or forming a readout circuitry in a silicon (Si) substrate using a method such as wafer-to-wafer bonding, and forming a photodiode on and/or over the readout circuitry has been made (referred to as a three-dimensional (3β) image sensor). The photodiode is connected with the readout circuitry through a metal interconnection.

In the related art, a contact plug connecting the readout circuitry and the photodiode causes a short in the photodiode.

Also, because both the source and the drain of the transfer transistor are heavily doped with N-type impurities, a charge sharing phenomenon occurs. When the charge sharing phenomenon occurs, the sensitivity of an output image is reduced and an image error may be generated.

In addition, because a photo charge does not readily move between the photodiode and the readout circuitry, a dark current is generated and/or saturation and sensitivity is reduced.

BRIEF SUMMARY

Embodiments provide an image sensor that can inhibit a short at a contact plug connecting a readout circuitry and an image sensing device, and a method for manufacturing the same.

Embodiments also provide an image sensor where a charge sharing does not occur while increasing a fill factor, and a method for manufacturing the same.

Embodiments also provide an image sensor that can minimize a dark current source and inhibit saturation reduction and sensitivity degradation by forming a smooth transfer path of a photo charge between a photodiode and a readout circuitry, and a method for manufacturing the same.

In one embodiment, an image sensor comprises: a readout circuitry at a first substrate; an interlayer dielectric on the first substrate; an interconnection in the interlayer dielectric, the interconnection being electrically connected to the readout circuitry; an image sensing device on the interconnection, the image sensing device comprising a first conductive type layer and a second conductive type layer; a contact electrically connecting the first conductive type layer of the image sensing device and the interconnection, the contact being electrically isolated from the second conductive type layer by an ion implantation region; and a pixel separation layer at a pixel boundary of the image sensing device.

In another embodiment, a method for manufacturing an image sensor comprises: forming a readout circuitry at a first substrate; forming an interlayer dielectric on the first substrate, and forming an interconnection electrically connected to the readout circuitry in the interlayer dielectric; forming an image sensing device comprising a first conductive type layer and a second conductive type layer on the interconnection; forming a pixel separation layer at the image sensing device; forming a first conductive type ion implantation region in the second conductive type layer; and forming a contact electrically connecting the first conductive type layer of the image sensing device to the interconnection, the first conductive type ion implantation region electrically isolating the contact from the second conductive type layer of the image sensing device.

The details of one or more embodiments are set forth in the accompanying drawings and the description below. Other features will be apparent from the description and drawings, and from the claims.

DETAILED DESCRIPTION

Hereinafter, embodiments of an image sensor and a method for manufacturing the same will be described with reference to the accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, or one or more intervening layers may also be present. In addition, it will also be understood that when a layer is referred to as being 'between' two layers, it can be the only layer between the two layers, or one or more intervening layers may also be present.

The present disclosure is not limited to a complementary metal oxide semiconductor (CMOS) image sensor, and thus, may be applied to an image sensor including a photodiode.

Figure 1:
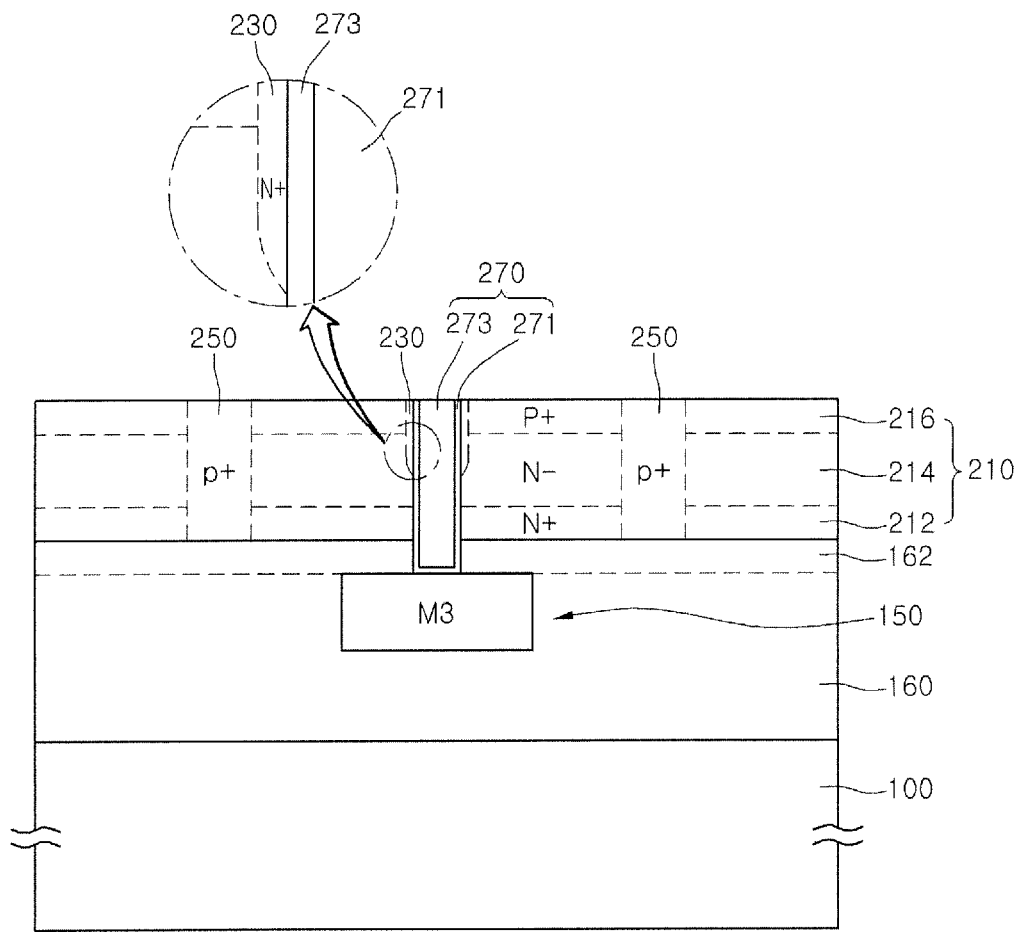
FIG. 1 is a cross-sectional view illustrating an image sensor according to a first embodiment.

FIG. 1 is a cross-sectional view illustrating an image sensor according to a first embodiment.

Figure 3:
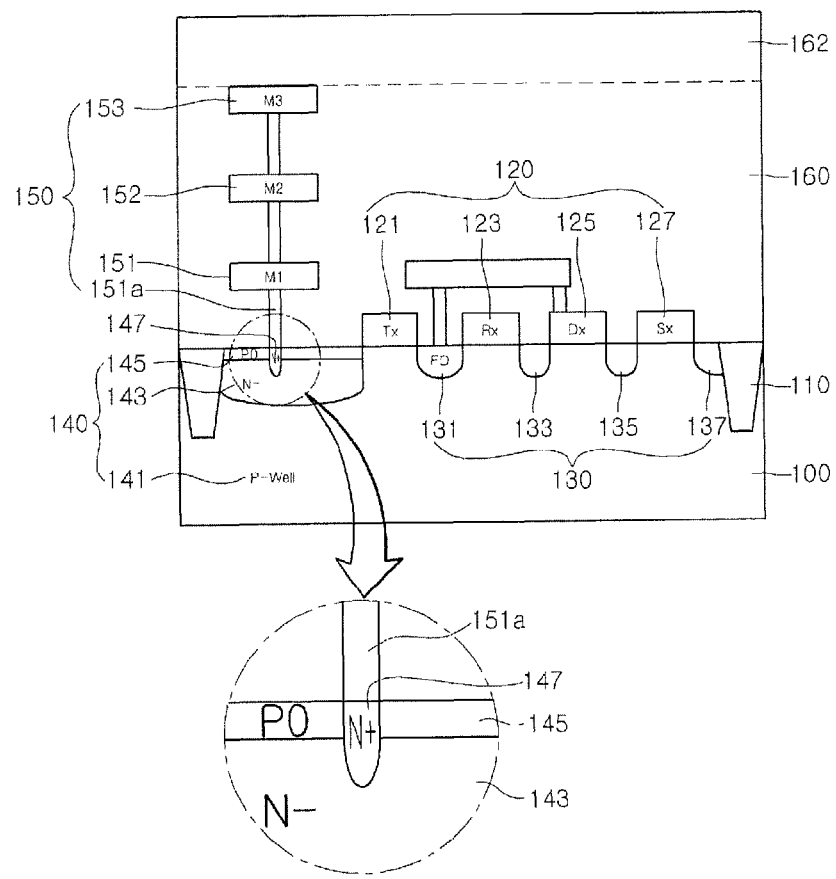

The image sensor according to the first embodiment may include: a readout circuitry 120 at a first substrate 100 as illustrated in FIG. 3; an interlayer dielectric 160 on the first substrate 100; an interconnection 150 electrically connected to the readout circuitry 120 and disposed in the interlayer dielectric 160; an image sensing device 210 including a first conductive type layer 214 and a second conductive type layer 216 on the interconnection 150; a contact 270 connecting the first conductive type layer 214 of the image sensing device 210 to the interconnection 150; and a pixel separation layer 250 at pixel boundaries of the image sensing device 210.

The image sensing device 210 may be a photodiode, but, without being limited thereto, may be a photogate, or a combination of the photodiode and the photogate. Embodiments include a photodiode formed in a crystalline semiconductor layer as an example. However, embodiments are not limited thereto, and may include, for example, a photodiode formed in amorphous semiconductor layer. Reference numerals, which are not described in FIG. 1, will be used in the following descriptions of a manufacturing method.

Hereinafter, a method for manufacturing an image sensor according to the first embodiment will be described with reference to FIGS. 2 to 9.

Figure 2:
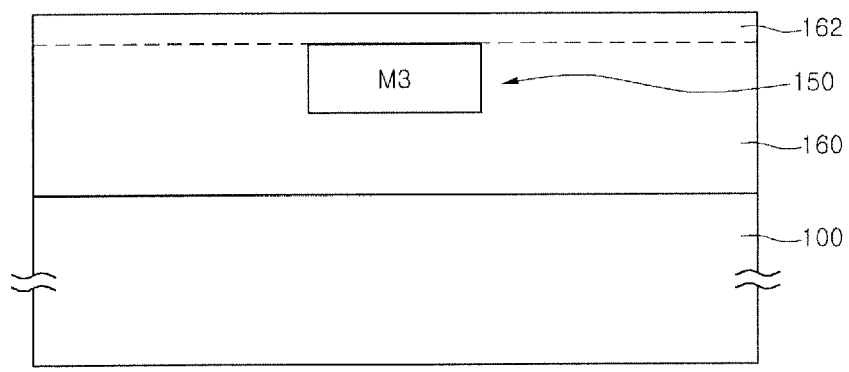
FIGS. 2 to 7 are cross-sectional views illustrating a method for manufacturing the image sensor, according to the first embodiment.

FIG. 2 is a schematic view illustrating a first substrate 100 provided with an interconnection 150. FIG. 3 is a detailed view of FIG. 2 in accordance with one embodiment. Hereinafter, a description will now be made on the basis of FIG. 3.

As illustrated in FIG. 3, an active region is defined by forming a device isolation layer 110 in the first substrate 100. The readout circuitry 120 may include a transfer transistor (Tx) 121, a reset transistor (Rx) 123, a drive transistor (Dx) 125, and a select transistor (Sx) 127. An ion implantation region 130, including a floating diffusion region (FD) 131 and a source/drain region 133, 135 and 137 for each transistor, may be formed.

According to an embodiment, an electrical junction region 140 can be formed on the first substrate 100, and a first conductive type connection 147 can be formed electrically connected to the interconnection 150 at an upper part of the electrical junction region 140.

For example, the electrical junction region 140 may be a P-N junction 140, but is not limited thereto. For example, the electrical junction region 140 may include a first conductive type ion implantation layer 143 formed on a second conductive type well 141 or second conductive type epitaxial layer, and a second conductive type ion implantation layer 145 formed on the first conductive type ion implantation layer 143. For example, as shown in FIG. 3, the P-N junction 140 may be a P0(145)/N−(143)/P−(141) junction, but embodiments are not limited thereto. The first substrate 100 may be a second conductive type substrate, but is not limited thereto.

According to an embodiment, the device is designed to provide a potential difference between the source and drain of the transfer transistor (Tx), thereby enabling the full dumping of a photo charge. Accordingly, a photo charge generated in the photodiode is dumped to the floating diffusion region, thereby increasing the output image sensitivity.

That is, as illustrated in FIG. 3 according to the first embodiment, the electrical junction region 140 is disposed at the first substrate 100 provided with the readout circuitry 120. Thus, a potential difference occurs between the source and drain of the transfer transistor (Tx), thereby enabling the full dumping of a photo charge.

Specifically, electrons generated in the photodiode 210 are transferred to the PNP junction 140, and they are transferred to the floating diffusion (FD) 131 node to be converted into a voltage when the transfer transistor (Tx) 121 is turned on.

The maximum voltage of the P0/N−/P− junction 140 becomes a pinning voltage, and the maximum voltage of the FD 131 node becomes Vdd minus the threshold voltage (Vth) of the reset transistor (Rx). Therefore, due to a potential difference between the source and drain of the Tx 121, without charge sharing, electrons generated in the photodiode 210 on the chip can be completely dumped to the FD 131 node.

The first conductive type connection 147 can be formed between the photodiode and the readout circuit to create a smooth transfer path of a photo charge, thereby making it possible to minimize a dark current source and inhibit saturation reduction and sensitivity degradation.

To this end, the first embodiment may form an N+ doping region as the first conductive type connection 147 for an ohmic contact on the surface of the P0/N−/P− junction 140. The N+ region (147) may be formed such that it penetrates the P0 region (145) to contact the N-region (143).

The width of the first conductive type connection 147 may be minimized to inhibit the first conductive type connection 147 from being a leakage source. To this end, a plug implant may be performed after etching a contact hole for a first metal contact 151a, but embodiments are not limited thereto. As another example, an ion implantation pattern (not shown) may be formed, and the ion implantation pattern may be used as an ion implantation mask to form the first conductive type connection 147.

Next, the interlayer dielectric 160 may be formed on the first substrate 100, and the interconnection 150 may be formed. The interconnection 150 may include the first metal contact 151a, a first metal 151, a second metal 152, and a third metal 153, but embodiments are not limited thereto.

A second interlayer dielectric 162 is formed on the interconnection 150. For example, the second interlayer dielectric 162 may be formed of a dielectric such as an oxide layer or a nitride layer. The second interlayer dielectric 162 increases bonding force of a second substrate (not shown), provided with the image sensing device 210, and the first substrate 100.

Figure 4:
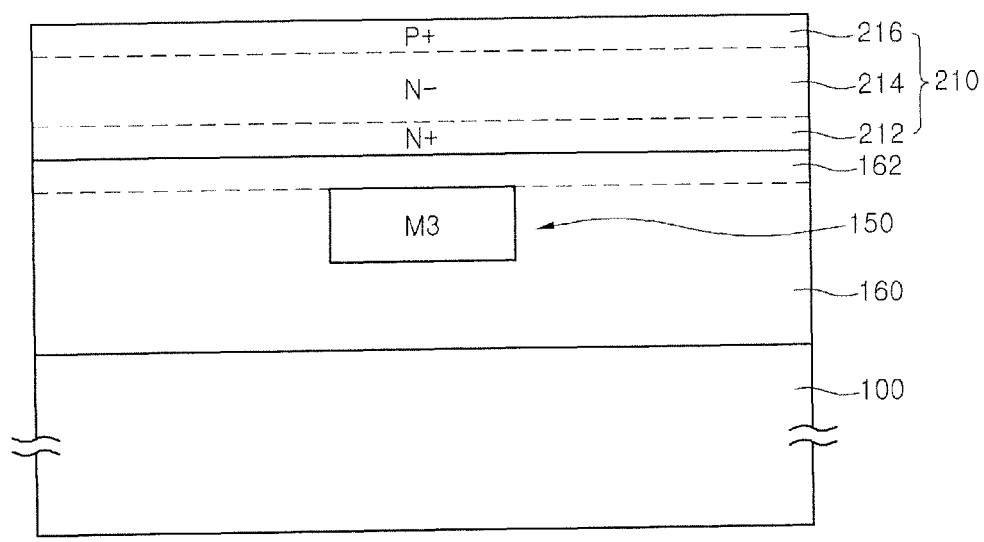

Referring to FIG. 4, the image sensing device 210 including the first conductive type layer 214 and the second conductive type layer 216 is formed on the second interlayer dielectric 162. The part of the first substrate (the second interlayer dielectric 162) upon which the image sensing device 210 is formed is also shown in FIG. 2.

According to an embodiment, a crystalline semiconductor layer of the second substrate may be provided with the photodiode including the N− layer (214) and the P+ layer (216). An N+ layer of the first conductive type layer 212 for an ohmic contact may be further provided.

Figure 5:
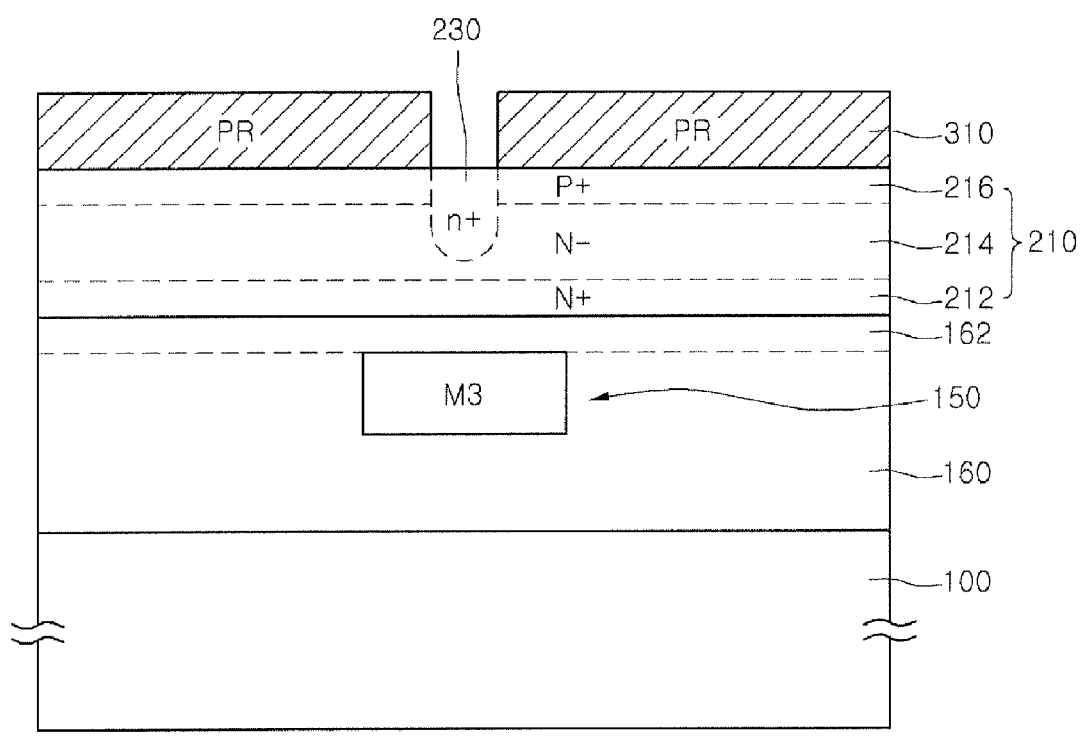
Figure 6:
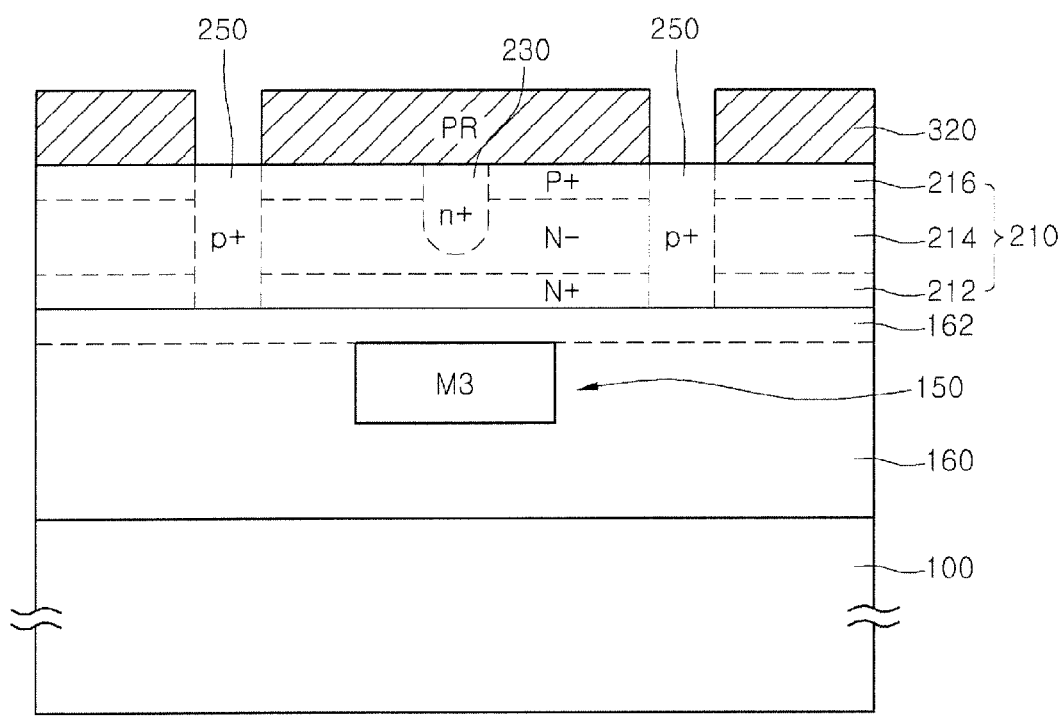

Referring to FIG. 5, a first conductive type ion implantation region 230 may be formed in the second conductive type layer 216 disposed on the upper side of the interconnection 150. For example, a photoresist pattern 310, exposing the second conductive type layer 216 disposed on the upper side of the interconnection 150, is used as an ion implantation mask to implant high concentration N type ions.

The first conductive type ion implantation region 230 can have the same depth as that of the second conductive type layer 216 disposed on the upper side of the interconnection 150.

That is, according to the first embodiment, the first conductive type ion implantation region 230 is formed in the second conductive type layer 216 in a region for contacting a contact plug, so as to avoid a short at the contact plug connecting the readout circuitry 120 and the image sensing device 210.

In a further embodiment, the first conductive type ion implantation region 230 has a depth greater than that of the second conductive type layer 216 disposed on the upper side of the interconnection 150, so as to more effectively avoid a short at the contact plug connecting the readout circuitry 120 and the image sensing device 210.

Thereafter, a pixel separation layer 250, dividing the image sensing device 210 by pixel, may be formed. For example, the pixel separation layer 250 may be an inter-pixel separation dielectric or an inter-pixel separation ion implantation layer.

The pixel separation layer 250 may be formed after forming the contact 270.

According to an embodiment, ion implantation for the first conductive type ion implantation region 230 and the pixel separation layer 250 is performed, and then, a laser annealing process for activation may be performed, but embodiments are not limited thereto.

Figure 7:
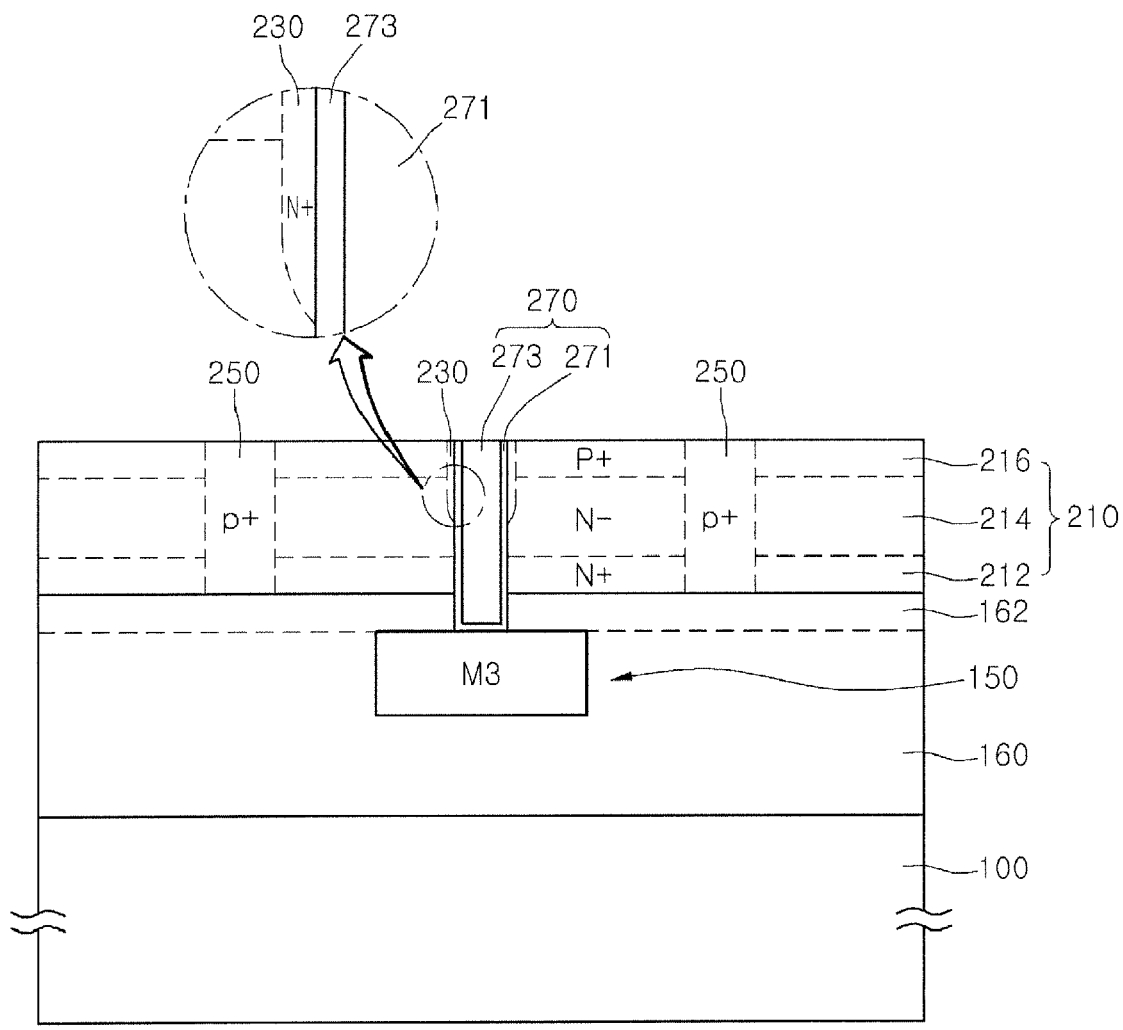

Referring to FIG. 7, the contact 270, electrically connecting the first conductive type layer 214 of the image sensing device 210 to the interconnection 150, is formed.

For example, the image sensing device 210 and the second interlayer dielectric 162 on the upper side of the interconnection 150 are partially removed to form a trench that exposes the interconnection 150. A dry etch process or a wet etch process may be performed to form the trench. A secondary etch process may be performed to discretely etch the image sensing device 210 and the second interlayer dielectric 162.

In this case, a portion of the image sensing device 210 is removed with a smaller width than that of the first conductive type ion implantation region 230, so that a portion of the first conductive type ion implantation region 230 remains between the second conductive type layer 216 and the contact 270 that is to be formed.

That is, according to the first embodiment, the first conductive type ion implantation region 230 is formed in the second conductive type layer 216 contacting the contact plug, so as to avoid a short at the contact plug connecting the readout circuitry 120 and the image sensing device 210.

Then, a barrier metal layer 271 may be formed on a surface of the trench, and the contact 270 may be formed on the barrier metal layer 271, thereby forming a contact plug 273 that fills the trench. The barrier metal layer 271 may be a single layer of Ti or TiN, or a Ti/TiN bilayer, and the contact plug 273 may be formed of tungsten (W), but embodiments are not limited thereto.

Thereafter, a ground process may be performed on the second conductive type layer 216.

According to the first embodiment, the first conductive type ion implantation region 230 is formed in the second conductive type layer 216 contacting the contact plug, so as to avoid a short at the contact plug connecting the readout circuitry 120 and the image sensing device 210.

Figure 8:
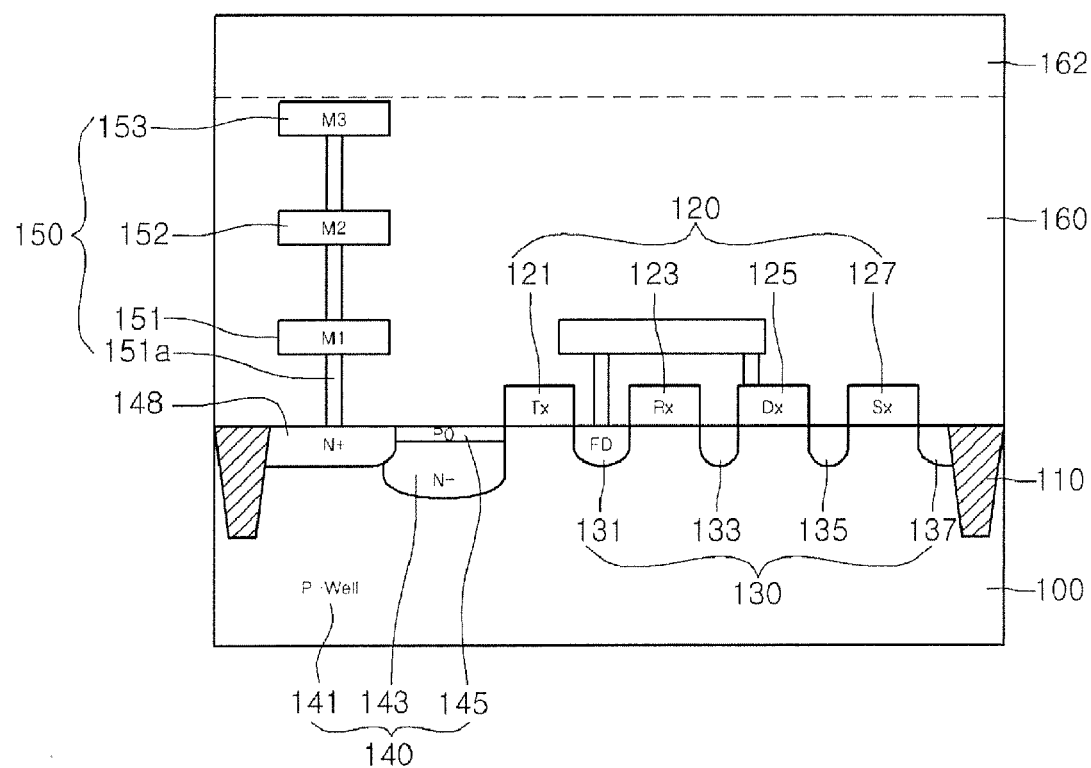
FIG. 8 is a cross-sectional view illustrating an image sensor according to a second embodiment.

FIG. 8 is a cross-sectional view illustrating an image sensor according to a second embodiment. The first substrate 100 provided with the interconnection 150 is illustrated in detail.

The second embodiment may adopt the technical features of the first embodiment.

The second embodiment is different from the first embodiment in that a first conductive type connection 148 is connected to a side of the electrical junction region 140.

The N+ connection region 148 may be formed at the P0/N−/P− junction 140 for an ohmic contact. In this case, a leakage source may be generated during the formation process of the N+ connection region 148 and the first metal contact 151a.

Also, when the N+ connection region 148 is formed over the surface of the P0/N−/P− junction 140, an electric field may be additionally generated due to N+/P0 junction 148/145. This electric field may also become a leakage source.

Therefore, the second embodiment proposes a layout in which the first contact plug 151a is formed in an active region not doped with a P0 layer, but rather includes the N+ connection region 148 that is electrically connected to the N-junction 143.

According to the second embodiment, the electric field is not generated on and/or over a Si surface, thereby contributing to reduction in a dark current of a 3D integrated CIS.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An image sensor comprising:
    a readout circuitry at a first substrate;
    an interlayer dielectric on the first substrate;
    an interconnection in the interlayer dielectric, the interconnection being electrically connected to the readout circuitry;
    an image sensing device on the interconnection, the image sensing device comprising a first conductive type layer and a second conductive type layer;
    a contact electrically connecting the first conductive type layer of the image sensing device and the interconnection, wherein the contact is disposed in a trench penetrating the image sensing device to expose the interconnection;
    an ion implantation region in the second conductive type layer; and
    a pixel separation layer at a pixel boundary of the image sensing device,
    wherein the ion implantation region comprises a first conductive type ion implantation region, the first conductive type on implantation region separating the contact and the second conductive type layer.

2. The image sensor according to claim 1, wherein the contact comprises:
    a barrier metal layer on a surface of the trench; and
    a contact plug on the barrier metal layer, the contact plug filling the trench.

3. The image sensor according to claim 1, wherein the ion implantation region has the same depth as that of the second conductive type layer disposed on an upper side of the interconnection.

4. The image sensor according to claim 1, wherein the ion implantation region has a depth greater than that of the second conductive type layer disposed on an upper side of the interconnection.

5. The image sensor according to claim 1, further comprising an electrical junction region electrically connected to the readout circuitry at the first substrate.

6. The image sensor according to claim 5, wherein the readout circuitry comprises a transistor, wherein the electrical junction region is disposed at the source of the transistor, whereby a potential difference is provided between the source and a drain of the transistor.

7. The image sensor according to claim 5, further comprising a first conductive type connection between the electrical junction region and the interconnection to electrically connect the electrical junction region and the interconnection, wherein the first conductive type connection is disposed at an upper part of the electrical junction region.

8. The image sensor according to claim 5, further comprising a first conductive type connection between the electrical junction region and the interconnection to electrically connect the electrical junction region and the interconnection, wherein the first conductive type connection is disposed at a side of the electrical junction region.

* * * * *